(12) United States Patent
Otsubo et al.

(10) Patent No.: US 11,264,366 B2
(45) Date of Patent: Mar. 1, 2022

(54) MODULE

(71) Applicant: Murata Manufacturing Co., Ltd., Kyoto (JP)

(72) Inventors: Yoshihito Otsubo, Kyoto (JP); Yukio Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 15 days.

(21) Appl. No.: 16/891,206

(22) Filed: Jun. 3, 2020

(65) Prior Publication Data

US 2020/0294980 A1 Sep. 17, 2020

Related U.S. Application Data

(63) Continuation of application No. PCT/JP2018/044499, filed on Dec. 4, 2018.

(30) Foreign Application Priority Data

Dec. 5, 2017 (JP) .............................. JP2017-233391

(51) Int. Cl.
*H01L 23/552* (2006.01)
*H01L 25/10* (2006.01)
(Continued)

(52) U.S. Cl.
CPC .......... *H01L 25/105* (2013.01); *H01L 23/293* (2013.01); *H01L 23/3128* (2013.01);
(Continued)

(58) Field of Classification Search
CPC ............... H01L 23/293; H01L 23/3128; H01L 23/49838; H01L 23/552; H01L 23/49827;
(Continued)

(56) References Cited

U.S. PATENT DOCUMENTS 8,399,992 B2 * 3/2013 Park .................... H01L 23/3128
257/777
9,793,246 B1 10/2017 Tseng et al.
(Continued)

FOREIGN PATENT DOCUMENTS

JP 2012023237 A 2/2012
JP 2015523743 A 8/2015
(Continued)

OTHER PUBLICATIONS

International Search Report for International Application No. PCT/JP2018/044499, dated Feb. 19, 2019.
(Continued)

*Primary Examiner* — Luan C Thai
(74) *Attorney, Agent, or Firm* — Pearne & Gordon LLP

(57) ABSTRACT

Provided is a module which has a package-on-package structure including a redistribution layer and can be easily reduced in height. A module includes an upper module including a substrate, a first component, and a sealing resin layer, and a lower module including an intermediate layer and a redistribution layer. The first component is connected to the redistribution layer with a columnar conductor interposed therebetween and provided in the intermediate layer, and both the first component and a second component are rewired by the redistribution layer. By fixing a resin block containing the second component to a lower surface of the substrate by a fixing conductor, positional deviation of the second component can be prevented. Further, by polishing an upper surface of the resin block, it is possible to improve the flatness.

8 Claims, 5 Drawing Sheets

(51) Int. Cl.
*H01L 23/29* (2006.01)
*H01L 23/31* (2006.01)
*H01L 23/498* (2006.01)
*H01L 23/00* (2006.01)
*H01L 25/00* (2006.01)

(52) U.S. Cl.
CPC .. *H01L 23/49827* (2013.01); *H01L 23/49838* (2013.01); *H01L 23/552* (2013.01); *H01L 24/16* (2013.01); *H01L 24/20* (2013.01); *H01L 25/50* (2013.01); *H01L 2224/16225* (2013.01); *H01L 2225/1035* (2013.01); *H01L 2225/1088* (2013.01); *H01L 2225/1094* (2013.01); *H01L 2924/3025* (2013.01)

(58) Field of Classification Search
CPC ................ H01L 24/20; H01L 25/105; H01L 2225/1035; H01L 2924/3025
USPC ........................................................ 257/659
See application file for complete search history.

(56) References Cited

U.S. PATENT DOCUMENTS

| | | | |
|---|---|---|---|
| 10,098,243 | B2 | 10/2018 | Furutani et al. |
| 10,109,541 | B2 | 10/2018 | Baek et al. |
| 10,199,337 | B2 * | 2/2019 | Park .................. H01L 23/48 |
| 2011/0068481 | A1 | 3/2011 | Park et al. |
| 2014/0036454 | A1 | 2/2014 | Caskey et al. |
| 2016/0037640 | A1 | 2/2016 | Takai et al. |
| 2016/0338202 | A1 | 11/2016 | Park et al. |

FOREIGN PATENT DOCUMENTS

| | | |
|---|---|---|
| JP | 2016063130 A | 4/2016 |
| JP | 2016082156 A | 5/2016 |
| JP | 2016213466 A | 12/2016 |
| JP | 2017092443 A | 5/2017 |
| WO | 2014171225 A1 | 10/2014 |

OTHER PUBLICATIONS

Written Opinion issued in International Application No. PCT/JP2018/044499, dated Feb. 19, 2019.

* cited by examiner

MODULE

This is a continuation of International Application No. PCT/JP2018/044499 filed on Dec. 4, 2018 which claims priority from Japanese Patent Application No. 2017-233391 filed on Dec. 5, 2017. The contents of these applications are incorporated herein by reference in their entireties.

BACKGROUND

Technical Field

The present disclosure relates to a module having a package-on-package structure including a redistribution layer.

As a module disclosed in Patent Document 1, there has been developed a module having a package-on-package (POP) structure which achieves high functionality in a small mounting area by stacking an electronic component including a plurality of packaged components. Since the module having the package-on-package structure can reduce the mounting area in a planar direction, reduction in size can be achieved. Further, in recent years, there has been developed also a module in which a large number of connection terminals can be provided even in a small size by forming a redistribution layer in a module having a package-on-package structure as a fan-out type configuration and which can cope with the miniaturization of components.

As illustrated in FIG. 10, in a module 100 described in Patent Document 1, a plurality of components 102 mounted on an upper surface 101a of a substrate 101 is mounted, and a support frame 103 is provided on a lower surface 101b of the substrate 101. Further, a component 104 is arranged in a cavity C surrounded by an inner peripheral surface 103a of the support frame 103 and the lower surface 101b of the substrate 101, and a mold resin 105 is filled in the cavity C. Note that the component 104 is bonded to the lower surface 101b of the substrate 101 by a shield member 106.

Thus, by providing the support frame 103 and the component 104 on the lower surface 101b side of the substrate 101, it is possible to provide the module 100 which has a package-on-package structure and can be easily reduced in height.

Patent Document 1: International Publication No. WO 2014/171225 (see paragraphs 0047 to 0051 and FIG. 3)

BRIEF SUMMARY

For example, it is conceivable to construct a package-on-package structure provided with a redistribution layer for realizing a fan-out structure. Here, in a case where a redistribution layer is provided in the above-described module 100 to make a fan-out module, since a narrow gap and a fine pitch are necessary for the redistribution layer, high positional accuracy is required for the component 104 connected to the redistribution layer. Additionally, in order to form a redistribution layer by a thin film, it is necessary to ensure flatness of a mounting surface 100a of the module 100. However, in a case where the component 104 is arranged on the lower surface 101b side of the substrate 101 by using solder or conductive paste, resin adhesive, or the like, there is a possibility that the component 104 is displaced due to pressure at the time when the mold resin 105 is formed. Further, with the configuration of the module 100, since it is difficult to polish the mounting surface 100a of the module 100 after forming the mold resin 105, it is also hard to ensure the flatness of the mounting surface 100a.

The present disclosure provides a module which has a package-on-package structure including a redistribution layer, prevents displacement between a component and the redistribution layer by fixing a resin block containing the component on a substrate by a fixing conductor provided on a surface thereof, and also ensures flatness by polishing the resin block.

A module according to the present disclosure includes a substrate; a first component mounted on one main surface of the substrate; a sealing resin layer for sealing the one main surface and the first component; a resin block provided on another main surface of the substrate; an intermediate layer provided on the other main surface of the substrate and having a plurality of first columnar conductors; and a redistribution layer laminated in a surface on an opposite side to the other main surface side of the substrate in the intermediate layer, in which the resin block is provided with a second component inside, and is fixed to the other main surface of the substrate by a fixing conductor provided on the other main surface side of the substrate in the resin block, the first component is connected to the redistribution layer with the first columnar conductor interposed between the first component and the redistribution layer, and the second component has an outer electrode on the redistribution layer side, and the outer electrode is connected to the redistribution layer.

According to this configuration, since the resin block containing the second component is fixed to the substrate by the fixing conductor provided on the surface, positional deviation of the second component can be prevented, so that high positional accuracy can be ensured. Further, by polishing the surface of the resin block, it is also possible to ensure flatness.

Additionally, a shield film may be formed on an outer peripheral surface of the resin block. According to this configuration, it is possible to provide a module having a package-on-package structure in which a shielding property and a heat dissipation property with respect to the second component are ensured.

Additionally, a second columnar conductor may be provided in the resin block. According to this configuration, it is possible to provide a conductive portion having a small gap with the second component. Further, by fixing the resin block to the other main surface of the substrate by the second columnar conductor, it is possible to prevent the positional deviation of the second component.

Additionally, the intermediate layer may have a frame-shaped substrate formed in a manner such that an inner peripheral surface surrounds the resin block. According to this configuration, by using a frame-shaped substrate provided with a columnar conductor and a via conductor, there is no need to additionally form a via conductor or a columnar conductor on a lateral side of the second component, whereby a manufacturing cost can be suppressed.

According to the present disclosure, it is possible to provide a module which prevents positional deviation of a component by using a resin block containing the component and also ensures flatness, in a package-on-package module including a redistribution layer.

DETAILED DESCRIPTION

First Embodiment

Figure 1:
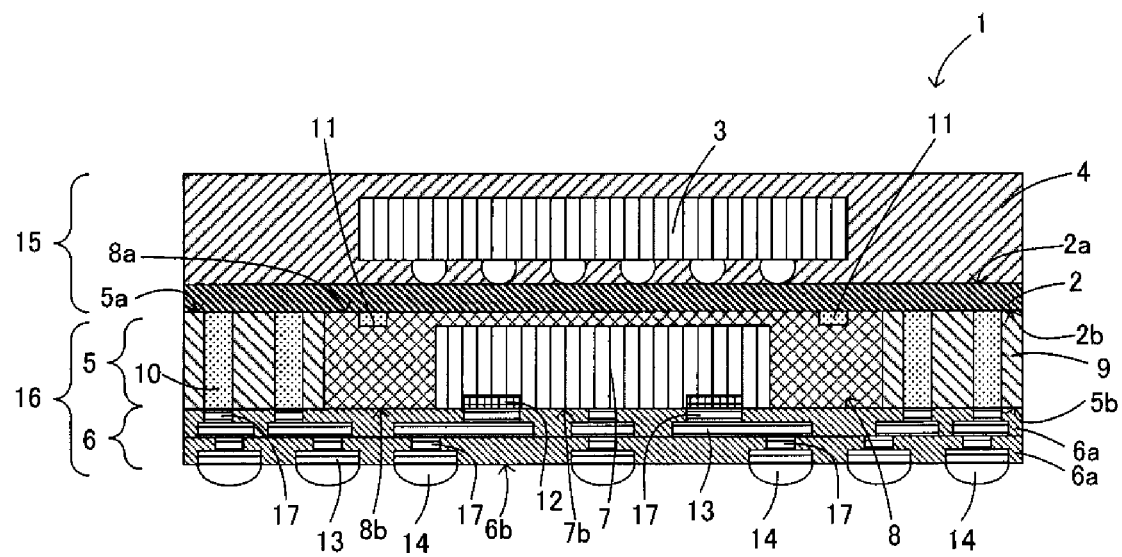
FIG. 1 is a cross-sectional view of a module according to a first embodiment of the present disclosure.
Figure 2:
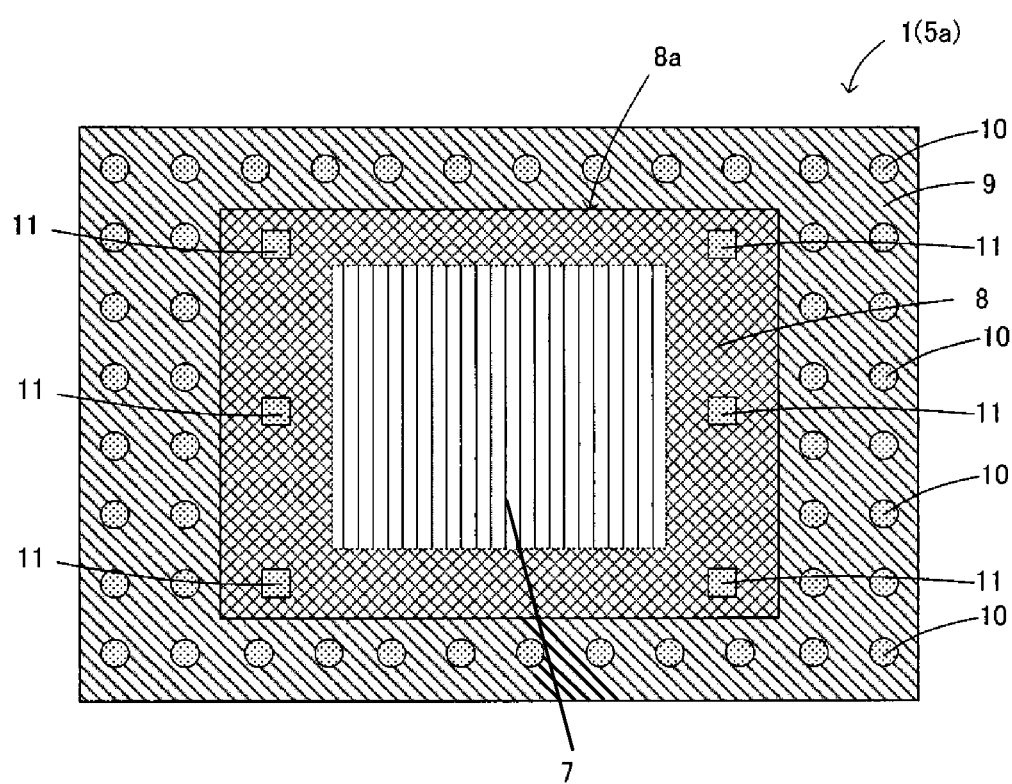
FIG. 2 is a top view of an intermediate layer of the module of FIG. 1.
Figure 3:
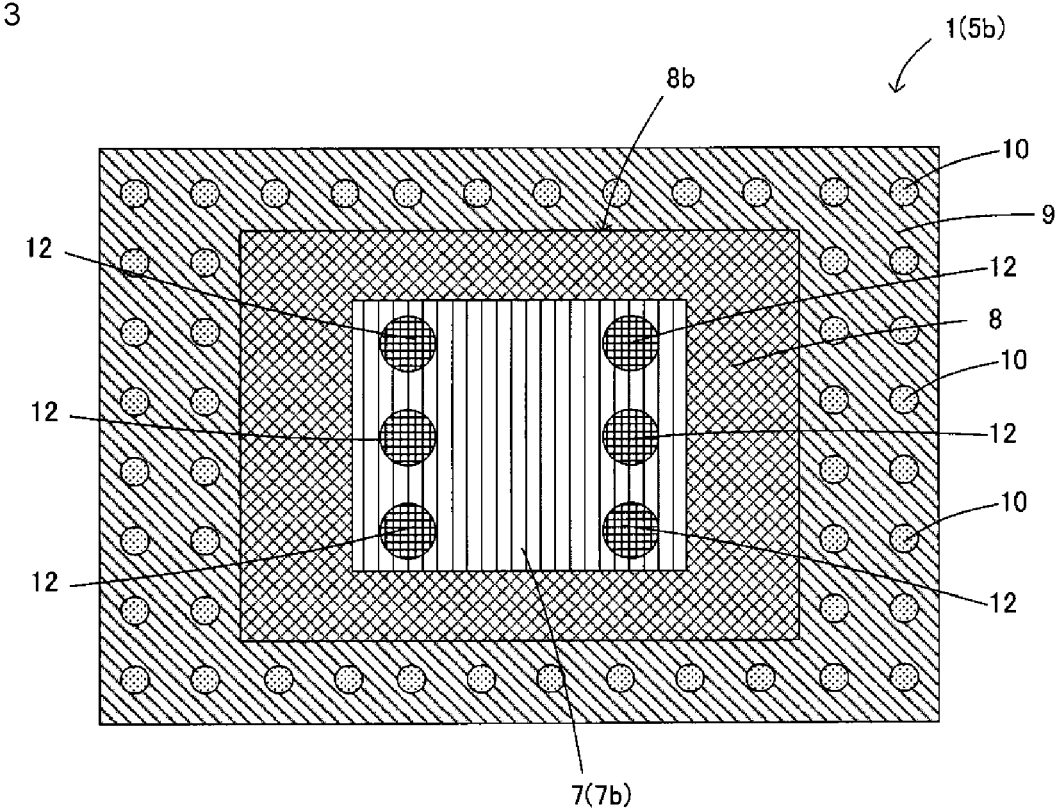
FIG. 3 is a bottom view of the intermediate layer of the module of FIG. 1.

A module 1 according to a first embodiment of the present disclosure will be described with reference to FIG. 1 to FIG. 3. Note that FIG. 1 is a cross-sectional view of the module 1 according to the first embodiment, and FIG. 2 is a top view of an intermediate layer of the module 1. FIG. 3 is a bottom view of the intermediate layer of the module 1.

The module 1 according to the first embodiment is mounted on, for example, a motherboard or the like of an electronic apparatus. As illustrated in FIG. 1, the module 1 includes a substrate 2 in which a first component 3 is mounted on an upper surface 2a (corresponding to "one main surface" of the present disclosure) and a sealing resin layer 4 is laminated, an intermediate layer 5 provided on a lower surface 2b (corresponding to "another main surface" of the present disclosure) of the substrate 2, and a redistribution layer 6 laminated on a lower surface 5b of the intermediate layer 5.

The intermediate layer 5 is configured by a resin block 8 containing a second component 7, a mold resin 9 provided around the resin block 8, and a first columnar conductor 10 erected on the mold resin 9. The resin block 8 is a block-like resin having a recess formed by a thermoplastic resin, such as a liquid crystal polymer, and the second component 7 is fitted into the recess. A fixing conductor 11 for fixing the resin block 8 to the lower surface 2b of the substrate 2 is provided on an upper surface 8a of the resin block 8, and the fixing conductor 11 and a land electrode (not illustrated) formed on the lower surface 2b of the substrate 2 are connected to each other, whereby the resin block 8 is fixed to the lower surface 2b of the substrate 2. Further, in the second component 7, an outer electrode 12 formed on a lower surface 7b is connected to a wiring electrode 13 of the redistribution layer 6 with a connection conductor 17 interposed therebetween. In this way, a part of an external connection terminal 14 is electrically connected to the second component 7. With such a configuration, when viewed from a direction perpendicular to the upper surface 2a of the substrate 2 (hereinafter referred to as a planar view), the external connection terminal 14 connected to the second component 7 can be arranged at an outer side portion of the second component 7. Furthermore, also in the first component 3, by connecting to the wiring electrode 13 of the redistribution layer 6 with a wiring (not illustrated) of the substrate 2, the first columnar conductor 10, and the connection conductor 17 interposed therebetween, a part of the external connection terminal 14 is electrically connected to the first component 3. With such a configuration, the external connection terminal 14 connected to the first component 3 in a planar view can be arranged at an outer side portion of the first component 3. As a result, it is possible to cope with an increase in the number of terminals.

Further, the module 1 has a package-on-package structure in which an upper module 15 configured by the substrate 2, the first component 3, and the sealing resin layer 4, and a lower module 16 configured by the intermediate layer 5 and the redistribution layer 6 are vertically connected to each other.

The substrate 2 is formed of, for example, a low temperature co-fired ceramic material, a glass epoxy resin, or the like. A plurality of land electrodes (not illustrated) is formed on the upper surface 2a and the lower surface 2b of the substrate 2, and a plurality of ground electrodes (not illustrated), a plurality of wiring electrodes (not illustrated), a plurality of via conductors (not illustrated), and the like are formed in a surface layer and an inner layer of the substrate 2. Note that each ground electrode is formed so as to be exposed from a side surface of the substrate 2, for example, and may be connected to a shield film.

Each land electrode, each ground electrode, and each wiring electrode are made of a metal commonly employed as an electrode, such as Cu, Ag, Al or the like. Additionally, each via conductor is made of a metal, such as Ag or Cu.

Examples of the first component 3 and the second component 7 include components, such as an inductor, a capacitor, an IC, a power amplifier, and the like. The first component 3 is mounted on the upper surface 2a of the substrate 2 by connecting a connection terminal (not illustrated) to a land electrode formed on the upper surface 2a of the substrate 2 by a solder bump. Further, the outer electrode 12 is formed on the lower surface 7b of the second component 7 and is connected to the wiring electrode 13 of the redistribution layer 6.

The sealing resin layer 4 is provided on the substrate 2 so as to cover the upper surface 2a and the first component 3 of the substrate 2. The sealing resin layer 4 may be formed of a resin commonly employed as a sealing resin, such as an epoxy resin containing a silica filler. In addition, in order to increase a thermal conductivity, a filler having a high thermal conductivity, such as an alumina filler may be used.

The resin block 8 is a block-like resin formed of a thermoplastic resin, such as a liquid crystal polymer for example, and a recess for fitting the second component 7 is formed. As illustrated in FIG. 2, the fixing conductor 11 is provided on a portion of the resin block 8 exposed from an upper surface 5a of the intermediate layer 5 (upper surface 8a of the resin block 8), and by connecting the fixing conductor 11 to a land electrode provided on the lower surface 2b of the substrate 2, the resin block 8 is fixed to the lower surface 2b of the substrate 2. Further, as illustrated in FIG. 3, the lower surface 7b of the second component 7 fitted in the recess of the resin block 8 is exposed from the lower surface 5b of the intermediate layer 5 and a lower surface 8b of the resin block 8, and the outer electrode 12 provided on the lower surface 7b of the second component 7 is connected to the wiring electrode 13 of the redistribution layer 6 with the connection conductor 17 interposed therebetween.

The mold resin 9 provided around the resin block 8 may be formed of a resin commonly employed as a sealing resin, such as epoxy resin containing a silica filler. Additionally, in order to increase a thermal conductivity, a filler having a high thermal conductivity, such as an alumina filler may be used.

The first columnar conductor 10 is a via conductor made of a metal, such as Cu, Ag, Al, or the like and electrically connects the wiring electrode of the substrate 2 to the wiring electrode 13 of the redistribution layer 6. Note that the first columnar conductor 10 may be formed using a metal pin made of a material, such as Cu, a Cu alloy, such as a Cu—Ni alloy, a Cu—Fe alloy, or the like, Fe, Au, Ag, Al, or the like.

The redistribution layer 6 is formed of a multilayer body of a plurality of resin layers 6a, and is laminated on the lower surface 5b of the intermediate layer 5, and a plurality of wiring electrodes 13 and a plurality of connection conductors 17 are formed in each resin layer 6a. The external connection terminal 14 for connecting to an external mother substrate or the like is formed on a lower surface 6b of the resin layer 6a in a lowermost layer of the redistribution layer 6. The first component 3 and the second component 7 are connected to the external connection terminal 14 with each wiring electrode 13, each connection conductor 17, and the first columnar conductor 10 interposed therebetween. At this time, in a plan view, the external connection terminal 14 connected to the first component 3 is positioned at an outer side portion of an outer shape of the first component 3, and the external connection terminal 14 connected to the second component 7 is positioned at an outer side portion of an outer shape of the second component 7. In addition, in a plan view, some of the external connection terminals 14 may be located inside the outer shape of the first component 3.

(Manufacturing Method of Module)

Next, a method of manufacturing the module 1 will be described.

First, the upper module 15 is formed. The substrate 2 in which a plurality of land electrodes is formed on the upper surface 2a and the lower surface 2b and a plurality of ground electrodes, a plurality of wiring electrodes, a plurality of via conductors, and the like are formed in the surface layer or the inner layer is prepared. For each land electrode, each ground electrode, and each wiring electrode, for example, each can be formed by applying a conductive paste containing a metal, such as Cu, Ag, Al, or the like by screen-printing or the like in a case of a low temperature co-fired ceramic substrate. Further, for each via conductor, after a via hole is formed by using a laser or the like, the via conductor can be formed by well-known methods.

Next, the first component 3 is mounted on the upper surface 2a of the substrate 2 by using a known surface mount technology. For example, the first component 3 is mounted by a solder bump, and then a reflow process is performed. Note that, after the reflow process, the substrate 2 may be cleaned as necessary. Then, the sealing resin layer 4 is formed so as to cover the first component 3 mounted on the upper surface 2a of the substrate 2. In addition, for the sealing resin layer 4, for example, a transfer molding method, a compression molding method, a liquid resin method, a sheet resin method, or the like can be used. Further, an epoxy resin containing a general silica filler may be used as the sealing resin layer 4. Note that in order to impart high thermal conductivity to the sealing resin layer 4, an epoxy resin containing a filler having a high thermal conductivity, such as an alumina filler may be used. In addition, after the sealing resin layer 4 is formed, plasma cleaning of the substrate 2 may be performed as necessary.

Next, the lower module 16 is formed. First, the resin block 8 containing the second component 7 is prepared. The resin block 8 is obtained by molding a thermoplastic resin, such as a liquid crystal polymer, into a block shape having a recess. The second component 7 is fitted to the recess of the resin block 8, and the fixing conductor 11 is arranged at a desired position on the upper surface 8a of the resin block 8. The fixing conductor 11 can be formed by, for example, applying a conductive paste containing a metal, such as Cu, Ag, Al, or the like on the upper surface 8a of the resin block 8 by screen-printing or the like. Alternatively, the upper surface 8a of the resin block 8 may be polished. In this manner, the flatness of the upper surface 8a and the lower surface 8b of the resin block 8 can be improved.

Then, the fixing conductor 11 is connected to the land electrode formed on the lower surface 2b of the substrate 2, thereby fixing the resin block 8 to the lower surface 2b of the substrate 2. Thereafter, the first columnar conductor 10 is mounted to a desired position of the lower surface 2b of the substrate 2 by a known mounting technique, such as solder mounting, and the mold resin 9 is laminated so as to cover the first columnar conductor 10 and a side surface of the resin block 8, whereby the intermediate layer 5 is formed. The mold resin 9 can be formed by, for example, a coating method, a printing method, a transfer molding method, a compression molding method, or the like.

Next, the redistribution layer 6 is formed on the lower surface 5b of the intermediate layer 5. The redistribution layer 6 is formed by laminating a plurality of resin layers 6a formed of polyimide or the like. The plurality of wiring electrodes 13 and the connection conductor 17 are formed in each resin layer 6a. Each wiring electrode 13 and each connection conductor 17 can be formed, for example, by forming a Ti film as a base electrode by sputtering or the like, similarly forming a Cu film on the Ti film by sputtering or the like, and similarly further forming a Cu film by electrolytic or electroless plating on the Cu film. In addition, each wiring electrode 13 is formed into a fine pattern by a photolithography process. Thereafter, the external connection terminal 14 is formed to complete the module 1.

Note that after fixing the resin block 8 on the lower surface 2b of the substrate 2, instead of forming the redistribution layer 6, the resin block 8 may be mounted on the redistribution layer 6 and then the resin block 8 may be fixed integrally with the redistribution layer 6 to the lower surface 2b of the substrate 2. In this case, after forming the upper module 15, the first columnar conductor 10 and the mold resin 9 are formed on the lower surface 2b of the substrate 2, and then the resin block 8 mounted on the redistribution layer 6 is fixed to the lower surface 2b of the substrate 2, whereby the lower module 16 can be formed.

According to the embodiment described above, since the resin block 8 containing the second component 7 is fixed to the lower surface 2b of the substrate 2 by the fixing conductor 11, positional deviation of the second component 7 can be prevented, so that high positional accuracy can be ensured. Also, by polishing the upper surface 8a of the resin block 8, the flatness of the lower surface 8b of the resin block 8 can also be improved. Further, since the upper module 15 and the lower module 16 can be stacked without necessarily using bumps, it is possible to provide a module having a package-on-package structure which can be easily reduced in height.

Second Embodiment

A module 1a according to a second embodiment of the present disclosure will be described with reference to FIG. 4. Note that FIG. 4 is a cross-sectional view of the module 1a according to the second embodiment.

Figure 4:
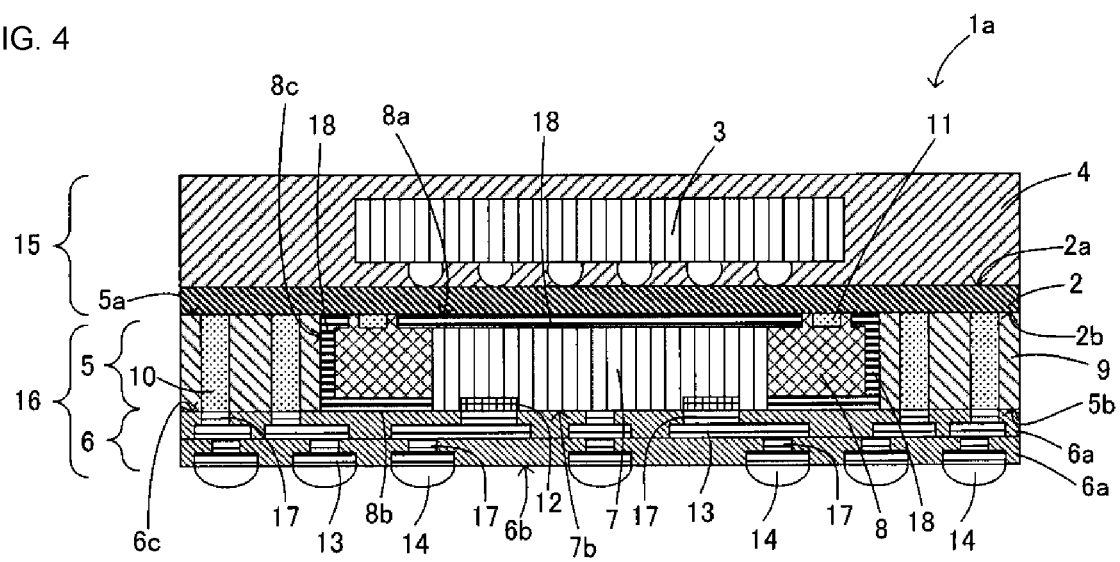
FIG. 4 is a view illustrating a modification of the module of FIG. 1.

The module 1a according to the second embodiment differs from the module 1 according to the first embodiment described with reference to FIG. 1 in that a shield film 18 is formed on an outer side surface, an upper surface, and a lower surface of the resin block 8, as illustrated in FIG. 4. Since other configurations are the same as those of the module 1 according to the first embodiment, the same reference numerals are given thereto, whereby description thereof will not be repeated.

As illustrated in FIG. 4, the shield film 18 is formed on an outer side surface 8c, the upper surface 8a, and the lower surface 8b of the resin block 8. The shield film 18 is used to block electromagnetic waves from the outside with respect to the second component 7 or electromagnetic waves generated from the second component 7 toward the outside, and is connected to the ground electrode of the substrate 2. The shield film 18 may be formed by a multilayer structure including an adhesive film, a conductive film laminated on the adhesive film, and a protective film laminated on the conductive film. The adhesive film may be made of a metal, such as SUS, for example. Moreover, the adhesive film may be made of Ti, Cr, Ni, TiAl, or the like. The conductive film is a layer which performs a substantial shield function of the shield film 18, and may be formed of, for example, any one of Cu, Ag, and Al. The protective film is provided to prevent corrosion or damage to the conductive film, and may be formed of, for example, SUS. Note that the protective film may be made of Ti, Cr, Ni, TiAl, or the like. Additionally, the shield film 18 may be formed by a MID method, such as LDS or MIPTEC.

Further, the shield film 18 on the upper surface 8a and the lower surface 8b of the resin block 8 may be a wiring electrode formed on the lower surface 2b of the substrate 2 and the upper surface 6c of the resin layer 6a in an uppermost layer of the redistribution layer 6.

According to the embodiment described above, since the shielding property with respect to the second component 7 are ensured, and at the same time, the shield film 18 functions as a heat dissipation material, the heat dissipation property with respect to the second component 7 can also be ensured.

Third Embodiment

A module 1b according to a third embodiment of the present disclosure will be described with reference to FIG. 5 and FIG. 6. Note that FIG. 5 is a cross-sectional view of the module 1b according to the third embodiment, and FIG. 6 is a bottom view of an intermediate layer of the module 1b.

Figure 5:
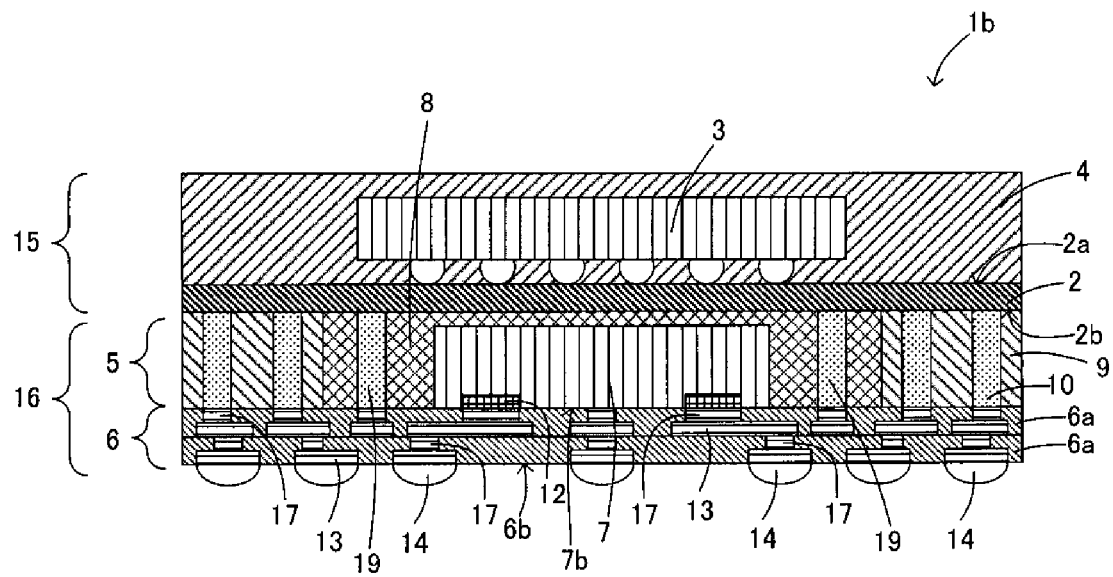
FIG. 5 is a cross-sectional view of a module according to a second embodiment of the present disclosure.
Figure 6:
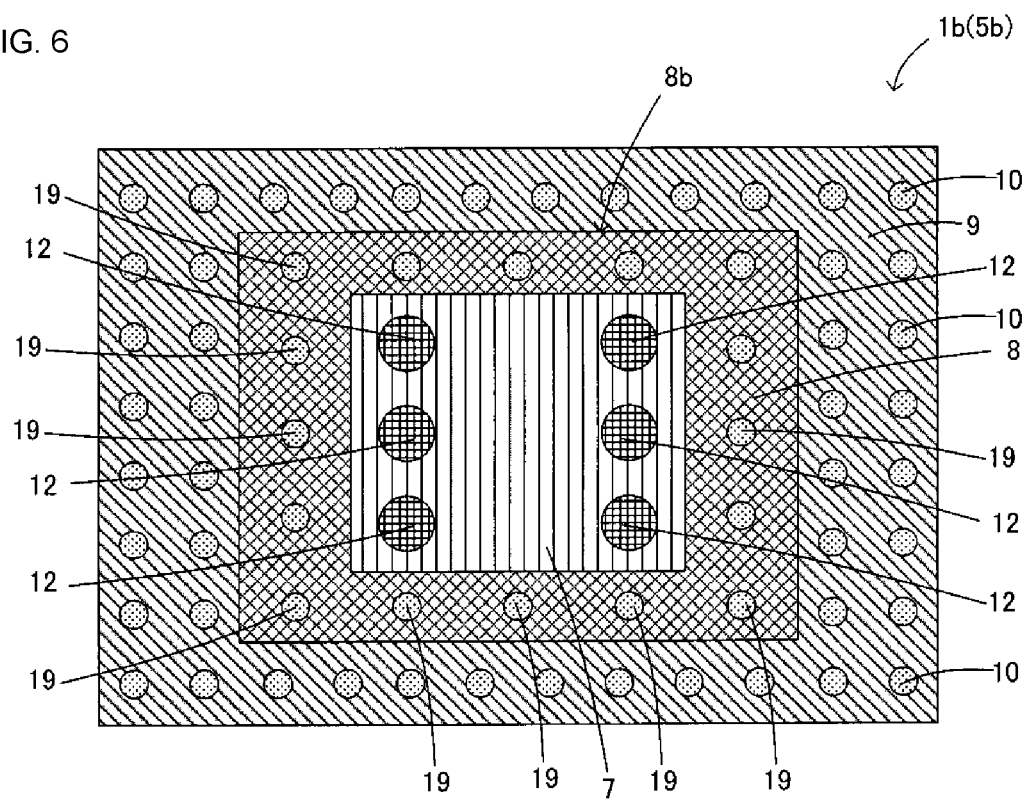
FIG. 6 is a plan view of the module of FIG. 5.

The module 1b according to the third embodiment differs from the module 1 according to the first embodiment described with reference to FIG. 1 in that a second columnar conductor 19 is provided so as to pass through the resin block 8, as illustrated in FIG. 5 and FIG. 6. Since other configurations are the same as those of the module 1 according to the first embodiment, the same reference numerals are given thereto, whereby description thereof will not be repeated.

In this embodiment, as illustrated in FIG. 5 and FIG. 6, the second columnar conductor 19 is provided so as to pass through the resin block 8. The second columnar conductor 19 is made of a metal, such as Cu, Ag, Al, or the like and electrically connects the wiring electrode of the substrate 2 and the wiring electrode 13 of the redistribution layer 6 with the connection conductor 17 interposed therebetween. Note that the second columnar conductor 19 may be formed using a metal pin made of a material, such as Cu, a Cu alloy, such as a Cu—Ni alloy, a Cu—Fe alloy, or the like, Fe, Au, Ag, Al, or the like, for example. By forming the second columnar conductor 19 so as to pass through the resin block 8, a gap with the second component 7 can be made smaller than that of the first columnar conductor 10. This is because the component is fitted into the resin block 8 in which the second columnar conductor 19 is formed in advance, so that the columnar conductor is not tilted or displaced during the resin molding process. With such a configuration, the entire module can be miniaturized. Further, the second columnar conductor 19 may be used as a fixing conductor.

According to the above-described embodiment, it is possible to provide a conductive portion between the substrate 2 and the redistribution layer 6, which has a gap with the second component 7 smaller than that of the first columnar conductor 10. Further, by using the second columnar conductor 19 as a fixing member for fixing the resin block 8 to the lower surface 2b of the substrate 2, it is possible to prevent the positional deviation of the second component 7.

(Modification)

A modification of the third embodiment will be described with reference to FIG. 7. Note that FIG. 7 is a cross-sectional view of a module 1c.

Figure 7:
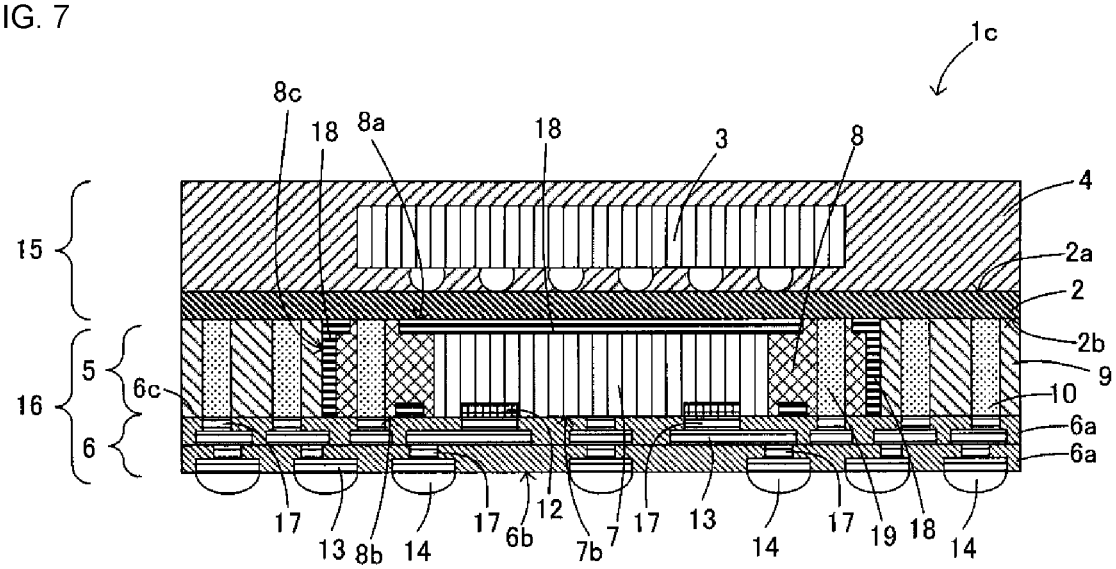
FIG. 7 is a view illustrating a modification of the module of FIG. 5.

As illustrated in FIG. 7, the shield film 18 may be formed on the outer side surface 8c, the upper surface 8a, and the lower surface 8b of the resin block 8. Note that the shield film 18 on the lower surface 2b of the substrate 2 and an upper surface 6c of the resin layer 6a in the uppermost layer of the redistribution layer 6 may be a wiring electrode formed on the lower surface 2b of the substrate 2 and the upper surface 6c of the resin layer 6a in the uppermost layer of the redistribution layer 6. In this way, it is possible to improve the shielding property and heat dissipation property with respect to the second component 7.

Fourth Embodiment

A module 1d according to a fourth embodiment of the present disclosure will be described with reference to FIG. 8 and FIG. 9. Note that FIG. 8 is a cross-sectional view of the module 1d according to the fourth embodiment, and FIG. 9 is a bottom view of an intermediate layer of the module 1d.

Figure 8:
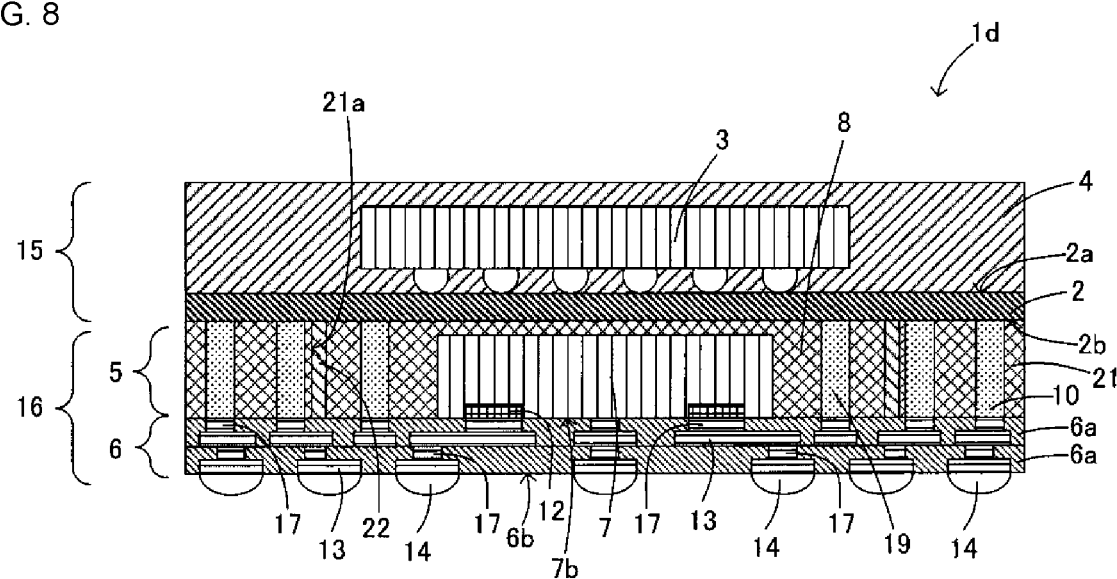
FIG. 8 is a cross-sectional view of a module according to a third embodiment of the present disclosure.
Figure 9:
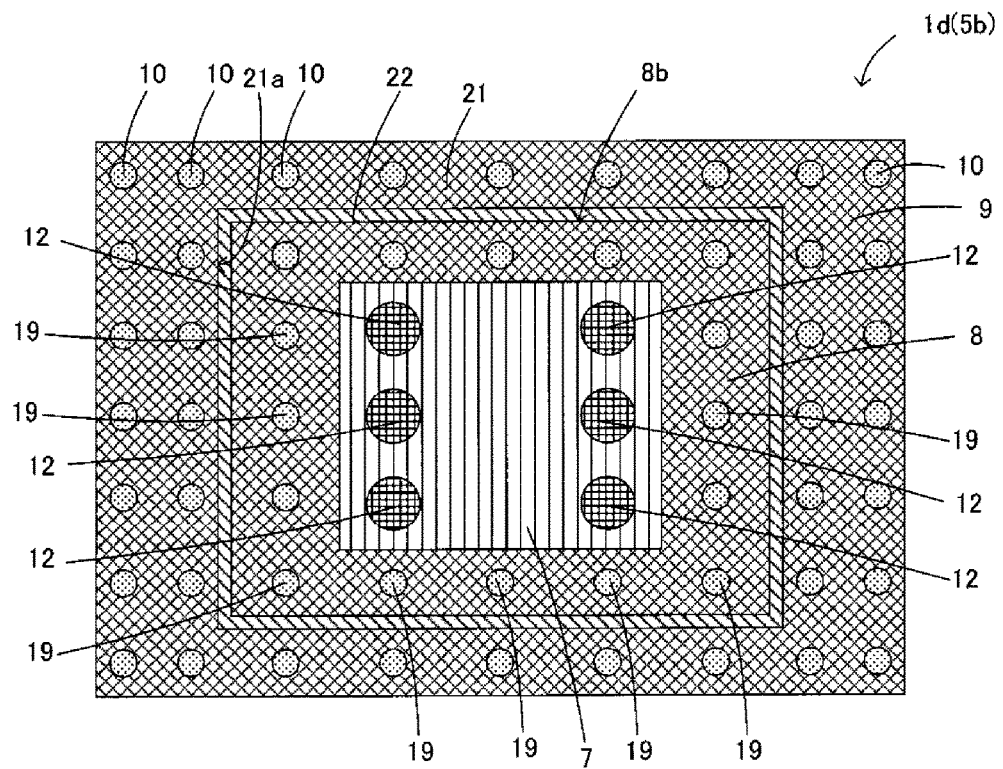
FIG. 9 is a plan view of the module of FIG. 8.
Figure 10:
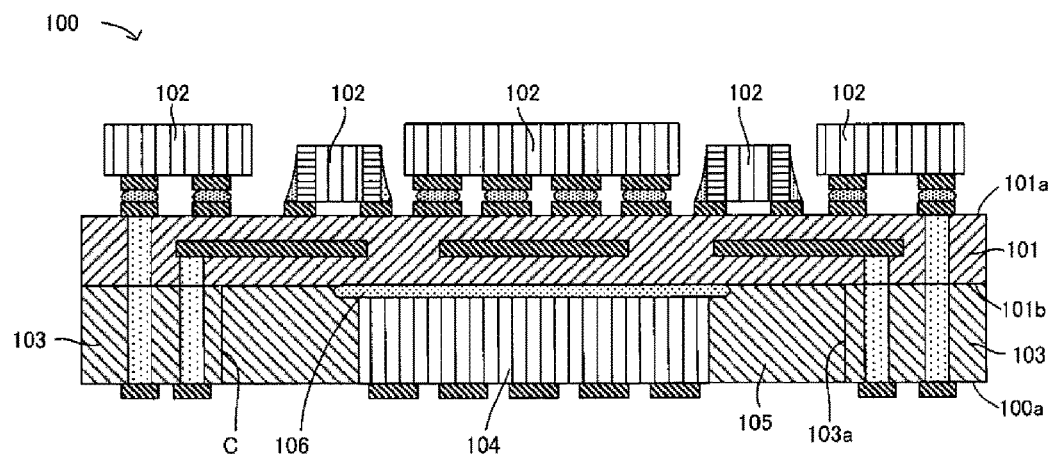
FIG. 10 is a cross-sectional view of an existing module.

The module 1d according to the fourth embodiment differs from the module 1 according to the first embodiment described with reference to FIG. 1 in that the intermediate layer 5 includes a frame-shaped substrate 21 as illustrated in FIG. 8 and FIG. 9. Since other configurations are the same as those of the module 1 according to the first embodiment, the same reference numerals are given thereto, whereby description thereof will not be repeated.

The frame-shaped substrate 21 is a multilayer substrate formed by laminating a plurality of insulating layers formed of an insulating material, such as, for example, a low temperature co-fired ceramic or a glass epoxy resin, and has a frame shape. As illustrated in FIG. 8 and FIG. 9, the frame-shaped substrate 21 has an outer shape substantially the same as the shape of the substrate 2, and is mounted on the lower surface 2b of the substrate 2 in a manner such that the resin block 8 is positioned in a region surrounded by an inner peripheral surface 21a of the frame-shaped substrate 21. In addition, the first columnar conductor 10 and various wiring electrodes (not illustrated) are formed inside the frame-shaped substrate 21. Note that the frame-shaped substrate 21 may be a single layer. That is, a connection conductor formed by a via, metal plating, or a metal pin may be formed in the frame-shaped resin molded body. Further, a resin 22 may be filled between the frame-shaped substrate 21 and the resin block 8.

According to the embodiment described above, by using the frame-shaped substrate 21 in the lower module 16, there is no need to additionally form the via conductor and the columnar conductor, so that it is possible to suppress the manufacturing cost.

Note that the present disclosure is not limited to the embodiments described above, and various modifications other than those described above may be made without necessarily departing from the spirit and scope of the present disclosure.

INDUSTRIAL APPLICABILITY

Further, the present disclosure can be applied to a module having a package-on-package structure including a redistribution layer.

REFERENCE SIGNS LIST

1, 1a to 1d MODULE
2 SUBSTRATE
2a UPPER SURFACE (ONE MAIN SURFACE)
2b LOWER SURFACE (ANOTHER MAIN SURFACE)
3 FIRST COMPONENT
4 SEALING RESIN LAYER
5 INTERMEDIATE LAYER
6 REDISTRIBUTION LAYER
7 SECOND COMPONENT
8 RESIN BLOCK
10 FIRST COLUMNAR CONDUCTOR
11 FIXING CONDUCTOR
18 SHIELD FILM
19 SECOND COLUMNAR CONDUCTOR
21 FRAME-SHAPED SUBSTRATE

The invention claimed is:

1. A module comprising:
a substrate;
a first component mounted on one main surface of the substrate;
a sealing resin layer sealing the one main surface and the first component;
a resin block provided on another main surface of the substrate;
an intermediate layer provided on the other main surface of the substrate and having a plurality of first columnar conductors; and
a redistribution layer laminated on a surface of the intermediate layer on an opposite side facing to the other main surface of the substrate,
wherein the resin block is provided with a second component inside, and the resin block is fixed to the other main surface of the substrate by a fixing conductor provided on the other main surface of the substrate in the resin block,
the first component is connected to the redistribution layer with the first columnar conductor interposed between the first component and the redistribution layer, and
the second component has an outer electrode on the redistribution layer side, and the outer electrode is connected to the redistribution layer.

2. The module according to claim 1, wherein a shield film is provided on an outer peripheral surface of the resin block.

3. The module according to claim 1, wherein a second columnar conductor is provided in the resin block.

4. The module according to claim 1, wherein the intermediate layer has a frame-shaped substrate so that an inner peripheral surface of the intermediate layer surrounds the resin block.

5. The module according to claim 2, wherein a second columnar conductor is provided in the resin block.

6. The module according to claim 2, wherein the intermediate layer has a frame-shaped substrate so that an inner peripheral surface of the intermediate layer surrounds the resin block.

7. The module according to claim 3, wherein the intermediate layer has a frame-shaped substrate so that an inner peripheral surface of the intermediate layer surrounds the resin block.

8. The module according to claim 2, wherein the shield film is disposed between the resin block and the substrate.

* * * * *